United States Patent [19]

Baudouin et al.

[11] Patent Number: 5,387,814

[45] Date of Patent: Feb. 7, 1995

[54] INTEGRATED CIRCUIT WITH SUPPORTS FOR MOUNTING AN ELECTRICAL COMPONENT

[75] Inventors: Daniel Baudouin, Missouri City; James Wallace, Sugarland; Ernie Russell, Richmond, all of Tex.

[73] Assignee: Texas Instruments Incorporated, Dallas, Tex.

[21] Appl. No.: 86,280

[22] Filed: Jun. 30, 1993

Related U.S. Application Data

[63] Continuation of Ser. No. 827,786, Jan. 29, 1992, abandoned.

[51] Int. Cl.⁶ .................. H01L 23/16; H01L 23/48
[52] U.S. Cl. .................. 257/690; 257/692; 257/532; 257/730; 257/787
[58] Field of Search ............ 357/68, 70, 72, 74, 357/51, 55; 257/690, 691, 692, 693, 532, 618, 666, 730, 773, 787

[56] References Cited

U.S. PATENT DOCUMENTS 4,598,307  7/1986  Wakabayashi et al. ............ 357/75

OTHER PUBLICATIONS

*Machine Design,* "Novel method cuts IC packaging costs", Jan. 26, 1989, p. 40.

*Primary Examiner*—Mark V. Prenty
*Attorney, Agent, or Firm*—W. James Brady, III; Richard L. Donaldson

[57] ABSTRACT

A packaged integrated circuit device (2) has exposed contacts (8a, 8b) for electrical connection to terminals of an electrical component, such as a bypass capacitor (10), mounted externally from packaging material (4). The contacts (8a, 8b) are electrically connected to power and ground leads (6) extending from packaging material (4).

7 Claims, 17 Drawing Sheets

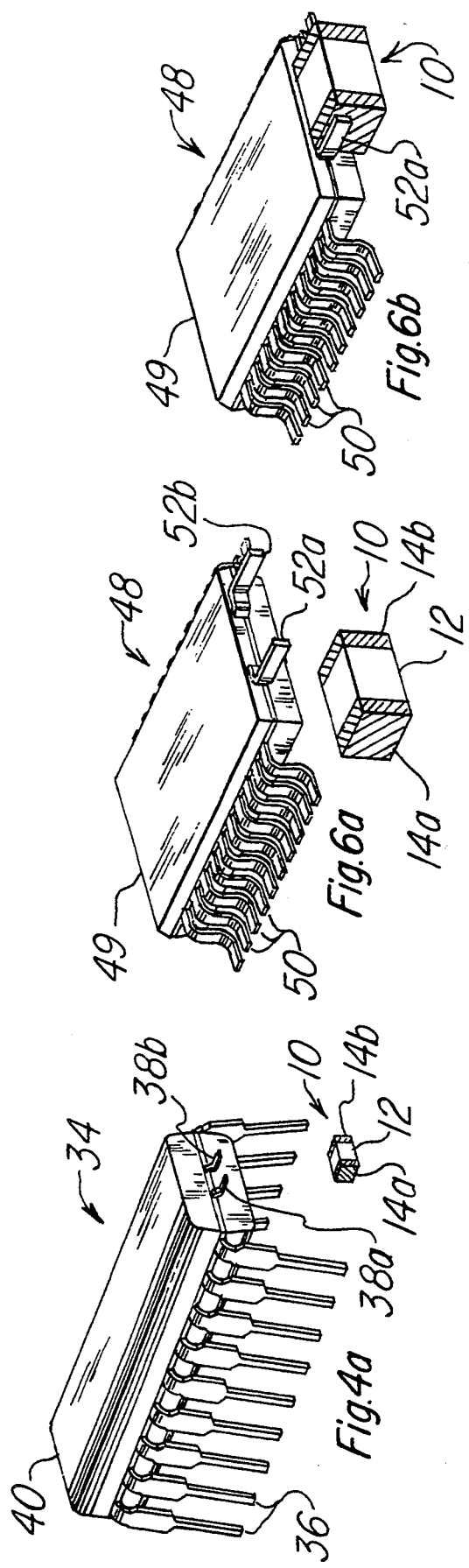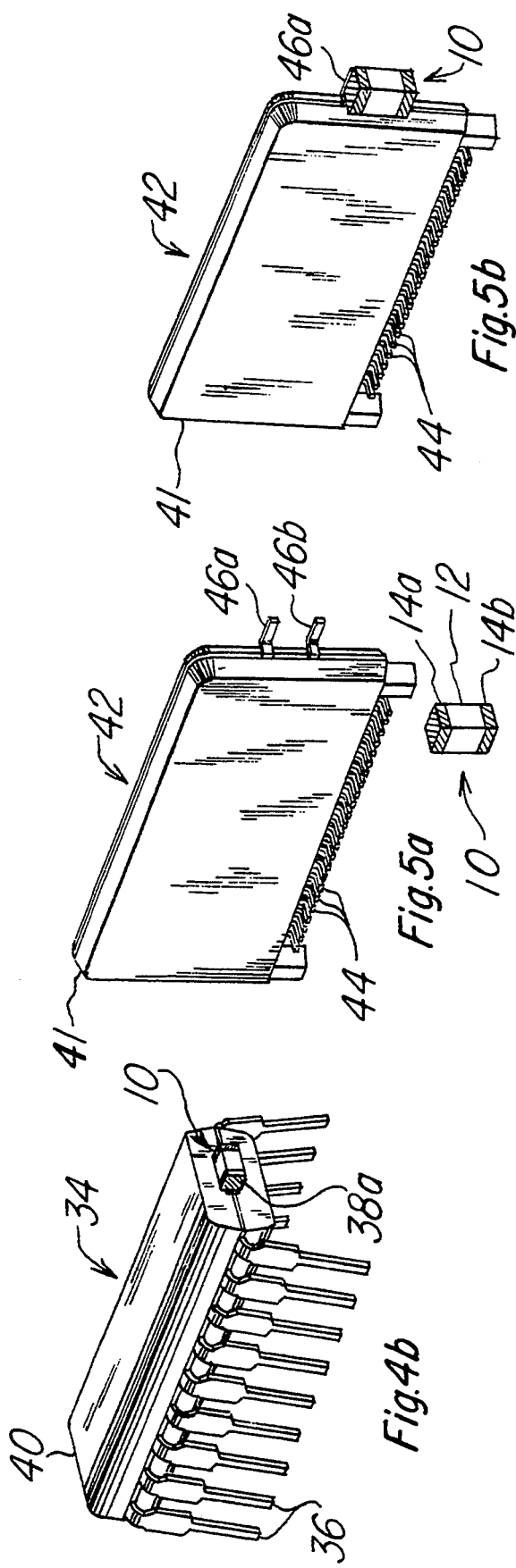

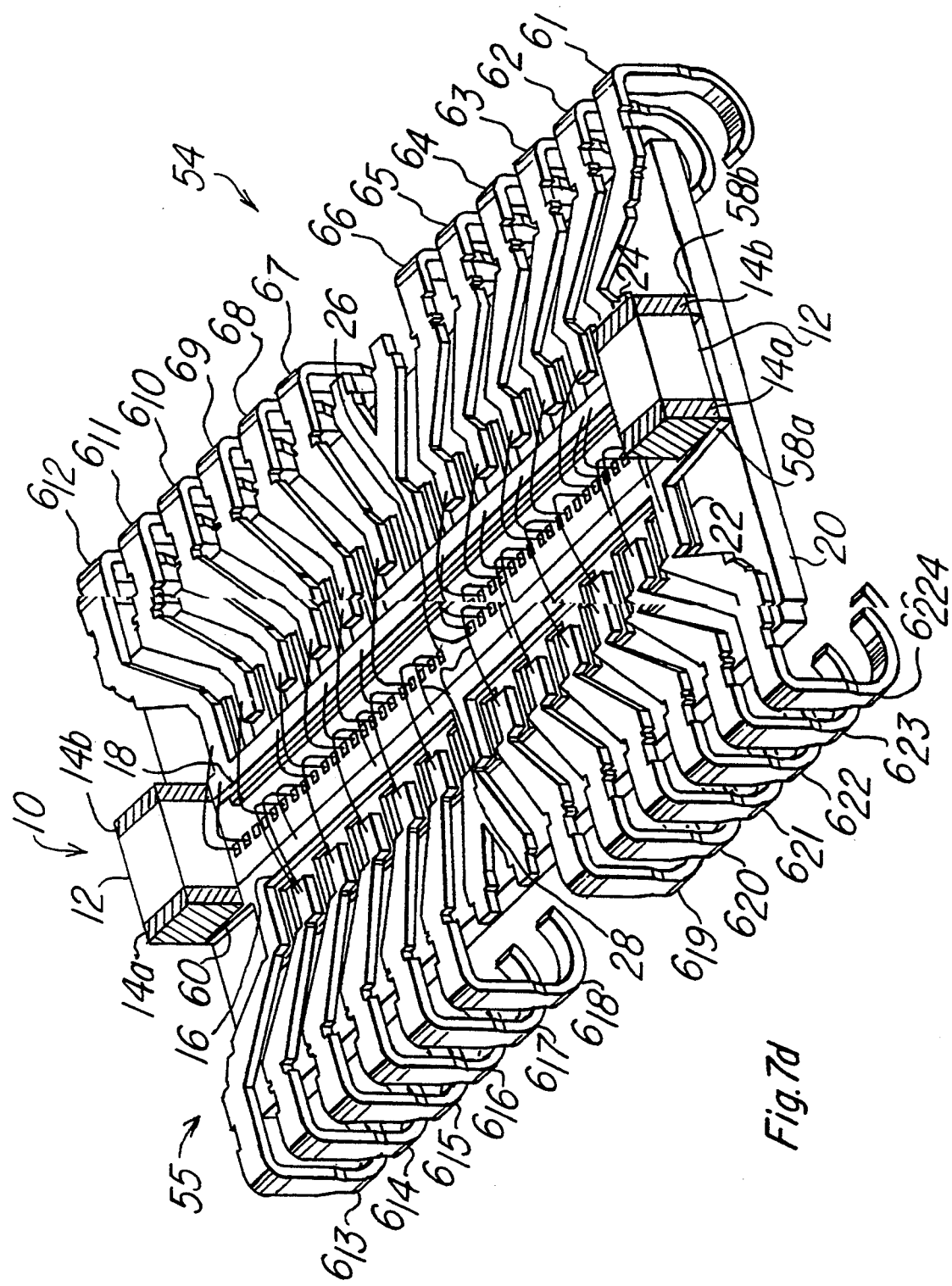

INTEGRATED CIRCUIT WITH SUPPORTS FOR MOUNTING AN ELECTRICAL COMPONENT

This application is a continuation of application Ser. No. 07/827,786, filed Jan. 29, 1992, and now abandoned.

FIELD OF THE INVENTION

This invention generally relates to integrated circuits and, more particularly, to a packaged integrated circuit having contacts for mounting an electrical component.

BACKGROUND OF THE INVENTION

Many integrated circuit devices require bypass or decoupling capacitors connected between the ground and power leads of the integrated circuit device to filter the output of the power supply which supplies power to the device.

In plastic packaged integrated circuits, a lead frame is provided having a plurality of leads that extend from the package. The leads are soldered to bonding pads on a printed circuit board in surface mount technology or to plated through holes in the printed circuit board in through-the-board technology. At least one of the leads is electrically connected via a bonding pad or through hole to a trace on the printed circuit board that supplies ground to the integrated circuit. At least one of the remaining leads is electrically connected via a bonding pad or through hole to a trace on the printed circuit board that supplies power to the integrated circuit.

Typically, the bypass capacitor for a plastic packaged integrated circuit device has a pair of terminals soldered to bond pads or through holes on the printed circuit board. One terminal is electrically connected via a bond pad or through hole and a printed circuit trace to the trace supplying ground to the integrated circuit device. The other terminal is electrically connected via a bond pad or through hole and a printed circuit trace to the trace supplying power to the integrated circuit device. For maximum effectiveness, it is desirable that the bypass capacitor be mounted as close as possible to the packaged integrated circuit device.

Several problems have been discovered that are associated with the mounting of bypass capacitors on printed circuit boards. These include the fact that printed circuit board layout considerations often prohibit the bypass capacitor from being mounted close to the integrated circuit device. This is especially true in situations where a plurality of integrated circuit devices, each having an associated bypass capacitor, must be densely mounted on a printed circuit board. In addition, the fact that the bypass capacitor is mounted directly on the printed circuit board reduces the amount of board space available for other devices or printed circuit traces. Further, where the bypass capacitor is to be mounted on the printed circuit board, there is no convenient way to test the integrated circuit device and the capacitor at the same time in their actual physical relationship prior to assembling components on the circuit board. This inability to test the integrated circuit device and the bypass capacitor together prior to assembling the components on the circuit board reduces integrated circuit yields because of guard band considerations.

A previous attempt to solve these problems is to mount the bypass capacitor inside the plastic package. A consequence of this solution is that the entire device must be discarded when the bypass capacitor goes bad. This is economically undesirable since the integrated circuit die encapsulated in the plastic package is generally much more expensive than the bypass capacitor.

SUMMARY OF THE INVENTION

Generally, and in one form of the invention, an integrated circuit includes a semiconductor die; a lead frame attached to the die, the lead frame including a first contact and a second contact; and packaging material encapsulating The die and a portion of the lead frame, the first and second contacts being exposed for electrical connection to terminals of an electrical component mounted externally from the packaging material.

BRIEF DESCRIPTION OF THE DRAWINGS

In the drawings:

FIG. 4a is a perspective view of a packaged integrated circuit device according to a fourth embodiment of the invention;

FIG. 4b shows the packaged integrated circuit device of FIG. 4a with a mounted decoupling capacitor;

FIG. 5a is a perspective view of a packaged integrated circuit device according to a fifth embodiment of the invention;

FIG. 5b shows the packaged integrated circuit device of FIG. 5a with a mounted decoupling capacitor;

FIG. 6a is a perspective view of a packaged integrated circuit device according to a sixth embodiment of the invention;

FIG. 6b shows the packaged integrated circuit device of FIG. 6a with a mounted decoupling capacitor;

FIG. 7d shows the device of FIG. 7b with a mounted decoupling capacitor.

Corresponding numerals and symbols in the different figures refer to corresponding parts unless otherwise indicated.

DETAILED DESCRIPTION OF PREFERRED EMBODIMENTS

Figure 1A:
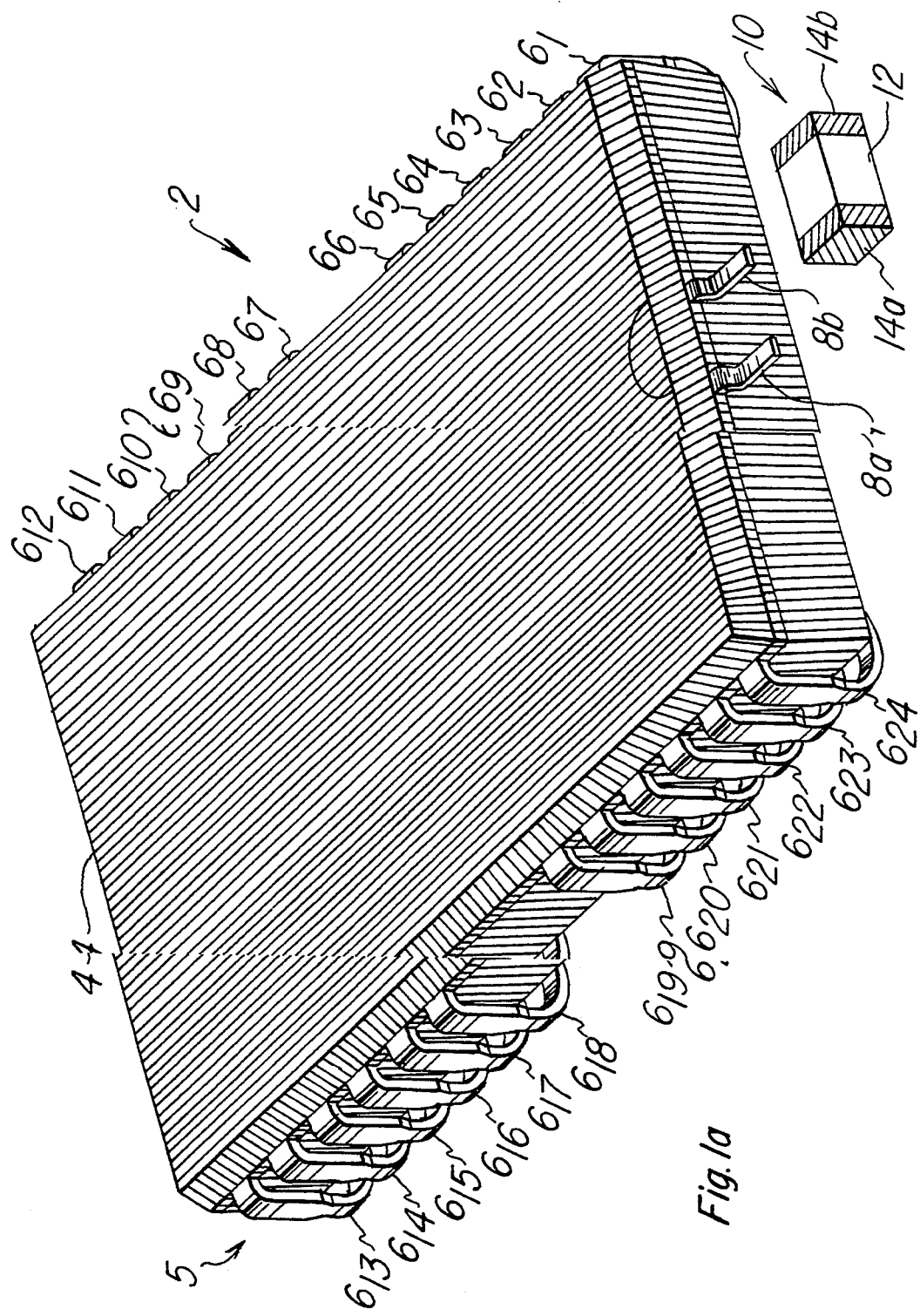
FIG. 1a is a perspective view of a packaged integrated circuit device according to a first embodiment of the invention.

FIG. 1a shows a plastic packaged integrated circuit memory device 2. Although memory device 2, as will be apparent from the following description, is a DRAM with a small-outline J-lead (SOJ) package of the lead over chip with center bond (LOCCB) type, it is understood that the invention is applicable to any packaged integrated circuit device having leads and requiring a bypass capacitor.

Memory device 2 includes a plastic package 4 that encapsulates a semiconductor die and a portion of a metal lead frame 5. The lead frame 5 includes J-shaped leads $6_1$–$6_{24}$ that extend from the package 4 and capacitor contacts 8a and 8b that are exposed for mounting a bypass capacitor 10 externally of package 4. Device 2 is mounted on a printed circuit board by soldering leads $6_1$–$6_{24}$ to bond pads on the printed circuit board. When device 2 is mounted on a printed circuit board, leads $6_1$ and $6_{12}$ couple an external Vdd power supply to device 2. Leads $6_{13}$ and $6_{24}$ supply ground to device 2. Leads $6_2$, $6_3$, $6_{22}$, and $6_{23}$ are data in/data out leads. Lead $6_4$ supplies write enable signals to device 2. Leads $6_5$ and $6_{21}$ supply row address strobe and column address strobe signals, respectively, to device 2. Leads $6_6$–$6_{11}$ and $6_{14}$–$6_{19}$ supply address signals to device 2.

Contact 8a is electrically connected to leads $6_{13}$ and $6_{24}$ within package 4 and is therefore coupled to ground when device 2 is mounted on a printed circuit board. Contact 8b is electrically connected to leads $6_1$ and $6_{12}$ within package 4 and is therefore coupled to the Vdd power supply when device 2 is mounted on a printed circuit board.

Bypass capacitor 10 includes a body portion 12 having conductive terminals 14a and 14b at opposite ends. Body portion 12 is formed from an insulating material, such as a ceramic. Terminals 14a and 14b are typically metal. Bypass capacitor 10 is mounted on device 2 by soldering terminals 14a and 14b to contacts 8a and 8b, respectively, as shown in FIG. 1c. Although subsequent surface mounting of device 2 may cause the solder bonding terminals 14a and 14b to contacts 8a and 8b to reflow, the surface tension of the solder and gravity hold capacitor 10 in its proper place until the solder solidifies. Reflow of the solder bonding terminals 14a and 14b to contacts 8a and 8b can be prevented by using a higher temperature solder to solder capacitor 10 to device 2 than that used to solder device 2 to the printed circuit board.

Figure 1B:
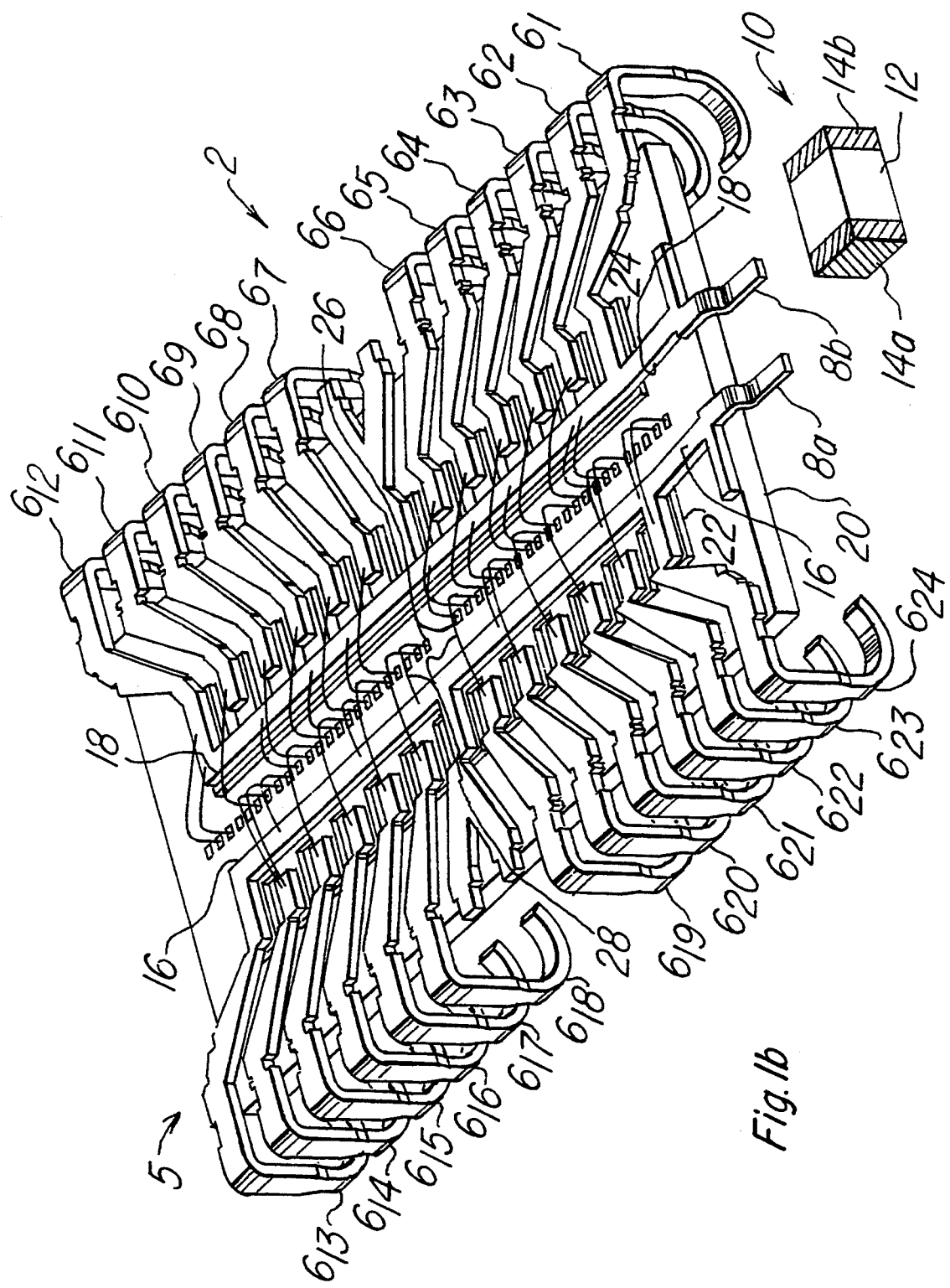
FIG. 1b shows the integrated circuit device of FIG. 1a with the plastic packaging removed.
Figure 1C:
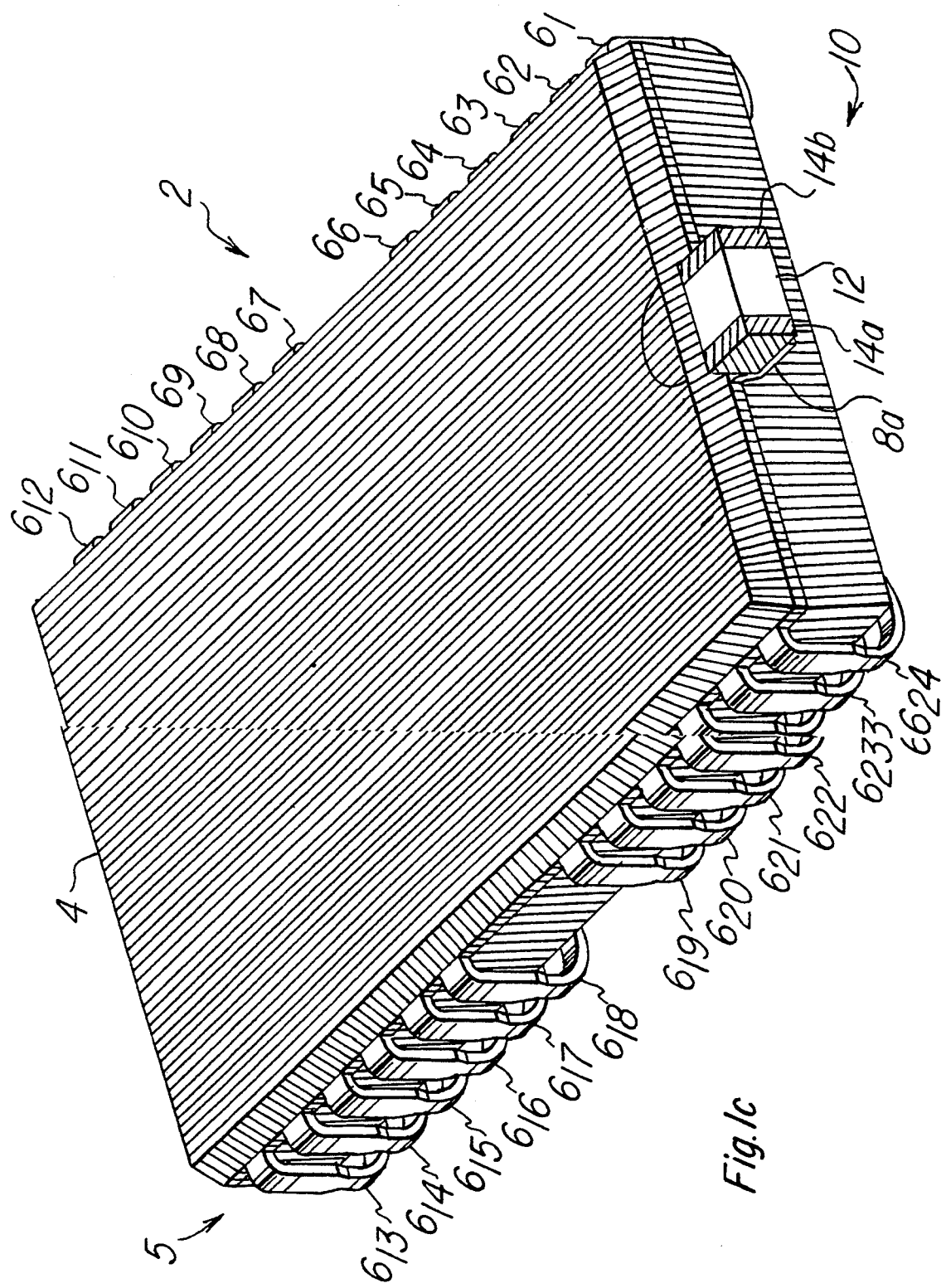
FIG. 1c shows the packaged integrated circuit device of FIG. 1a with a mounted decoupling capacitor.

FIG. 1b shows device 2 of FIG. 1a with plastic packaging 4 removed. The lead frame 5 includes a ground bus portion 16 that is integrally formed with leads $6_{13}$ and $6_{24}$ and contact 8a and a Vdd bus portion 18 that is integrally formed with leads $6_1$ and $6_{12}$ and contact 8b. Ground bus portion 16 electrically connects leads $6_{13}$ and $6_{24}$ to contact 8a and Vdd bus portion 18 electrically connects leads $6_1$ and $6_{12}$ to contact 8b. Capacitor 10 when soldered to contacts 8a and 8b is therefore electrically coupled between the leads supplying ground and Vdd to device 2.

Device 2 includes a semiconductor die 20 having bond pads 26 located in the center of its upper surface. The lead frame is tape-bonded to the upper surface of die 20 adjacent bond pads 26. Leads $6_1$–$6_{12}$ and bus portion 18 are bonded to the upper surface of die 20 on one side of bond pads 26 by tape 24. Leads $6_{13}$–$6_{24}$ and bus portion 16 are bonded to the upper surface of die 20 on the other side of bond pads 26 by tape 22. Wires 28 are each bonded at one end to one of leads $6_1$–$6_{24}$ and bus portions 16 and 18 and at the other end to one of bond pads 26 to electrically connect leads $6_1$–$6_{24}$ and bus portions 16 and 18 to appropriate bond pads 26.

Figure 1D:
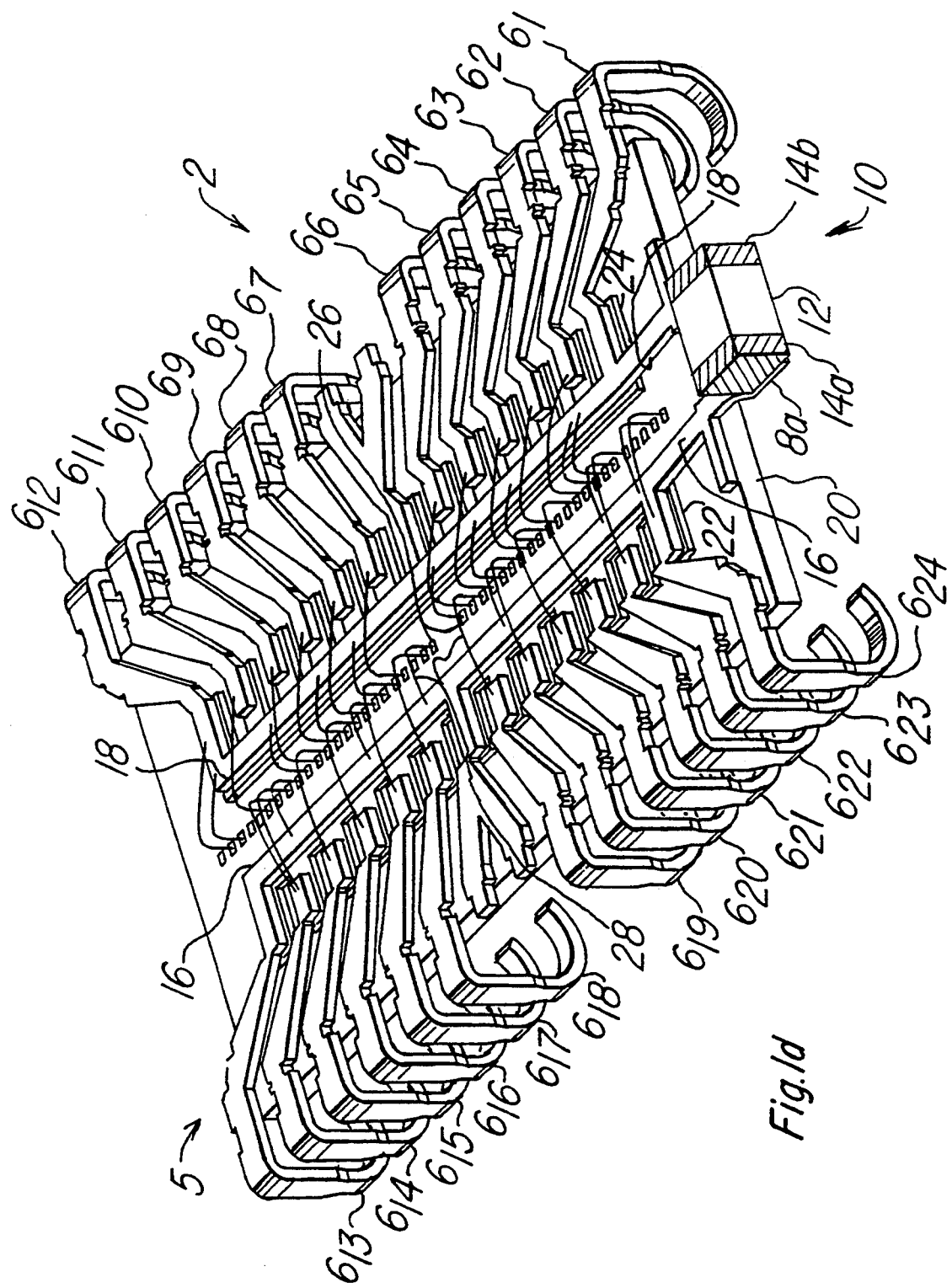
FIG. 1d shows the device of FIG. 1b with a mounted decoupling capacitor.

Several advantages of the invention are that bypass capacitor 10, when soldered to contacts 8a and 8b as seen in FIGS. 1c and 1d, is located extremely close to device 2 and is positioned well above the portions of leads $6_1$–$6_{24}$ that are soldered to a printed circuit board, and that the capacitor and packaged integrated circuit device may be tested together prior to mounting on a printed circuit board. The fact that bypass capacitor 10 is positioned so closely to device 2 insures effective decoupling. The fact that bypass capacitor 10 is spaced from the printed circuit board when device 2 is soldered to a printed circuit board permits an increase in printed circuit board density. Other components may be mounted on the printed circuit board below bypass capacitor 10 to increase printed circuit board density. Alternatively, additional printed circuit traces may be formed on the printed circuit board below bypass capacitor 10 to increase printed circuit board density. The ability to test the capacitor and integrated circuit device together prior to mounting on a printed circuit board significantly reduces the time required to test and repair assembled circuit board assemblies.

Although contacts 8a and 8b are shown extending from one end of device 2, it is understood that the lead frame can also be configured so that the contacts extend instead from either the opposite end of device 2, the side from which leads $6_1$–$6_{12}$ extend, the side from which leads $6_{13}$–$6_{24}$ extend, the top surface of device 2, or the bottom surface of device 2. In addition, although contacts 8a and 8b are shown contacting the same side of capacitor 10, it is understood that the contacts may be positioned to contact different sides of capacitor 10. Alternatively, one or more of the contacts may be configured to simultaneously contact more than one side of capacitor 10.

FIGS. 2a–2d show a plastic packaged integrated circuit memory device 32 according to a second embodiment of the invention. Device 32 is identical to device 2 of FIGS. 1a–1d with the exception that additional capacitor contacts 30a and 30b are provided. Contacts 30a and 30b contact terminals 14a and 14b, respectively, at opposing ends of bypass capacitor 10. Contacts 30a and 30b are formed during the lead frame forming step so as to be spaced apart by a distance x which is slightly less than the distance l, the length of the capacitor. Accordingly, when bypass capacitor 10 is placed on contacts 8a and 8b for soldering, it is held firmly in place by spring tension provided by contacts 30a and 30b on opposing ends of capacitor 10.

Bypass capacitor 10 may be mounted on device 32 by soldering terminal 14a to contacts 8a and 30a and by soldering terminal 14b to contacts 8b and 30b. Contacts 30a and 30b help prevent capacitor 10 from being inadvertently misaligned or knocked off contacts 8a and 8b prior to soldering. In addition, should the solder bonding terminals 14a and 14b to contacts 8a, 8b, 30a, and 30b reflow during surface mounting of device 32 on a printed circuit board, contacts 30a and 30b help hold capacitor 10 in place until the solder solidifies.

Although use of contacts 30a and 30b in conjunction with contacts 8a and 8b provides added support to capacitor 10, it is understood that contacts 8a and 8b may be eliminated and lead frame 5 provided solely with contacts 30a and 30b for mounting capacitor 10.

FIGS. 3a–3d show a plastic packaged integrated circuit memory device 33 according to a third embodiment of the invention. Device 33 is identical to device 2 of FIGS. 1a–1d with the exception that capacitor contacts 35a and 35b are provided in place of contacts 8a and 8b. Contact 35a is provided with surfaces 37a, 39a, and 41a for contacting different sides of terminal 14a. Contact 35b is provided with surfaces 37b, 39b, and 41b for contacting different sides of terminal 14b. Surfaces 37a and 37b contact terminals 14a and 14b, respectively, at opposing ends of capacitor 10. Surfaces 39a and 39b contact terminals 14a and 14b on the top side of capacitor 10. Surfaces 43a and 43b contact terminals 14a and 14b on the bottom side of capacitor 10. Surfaces 37a and 37b are formed during the lead frame forming step so as to be spaced apart by a distance x which is slightly less than the distance l, the length of the capacitor. Accordingly, when bypass capacitor 10 is placed on contacts 35a and 35b for soldering, it is held firmly in place by spring tension provided by surfaces 37a and 37b on opposing ends of capacitor 10.

Bypass capacitor 10 may be mounted on device 33 by soldering terminal 14a to contact 35a and by soldering terminal 14b to contact 35b. Contacts 35a and 35b help prevent capacitor 10 from being inadvertently misaligned or knocked off prior to soldering. In addition, should the solder bonding terminals 14a and 14b to contacts 35a and 35b reflow during surface mounting of device 33 on a printed circuit board, contacts 35a and 35b help hold capacitor 10 in place until the solder solidifies.

FIGS. 4a and 4b show a packaged integrated circuit device 34 in a dual-in-line package (DIP). Device 34 has a lead frame that includes a plurality of leads 36 and a pair of capacitor contacts 38a and 38b extending from plastic package 40 as shown in FIG. 4a. When device 34 is mounted on a printed circuit board at least one of leads 36 is connected to a source of ground and at least one of the remaining leads 36 is connected to a source of power. Contact 38a is electrically connected with a lead 36 that supplies ground to device 34 via a lead frame ground bus (not shown) within plastic package 40. Contact 38b is electrically connected with a lead 36 that supplies power to device 34 via a lead frame power bus (not shown) within plastic package 40. Terminals 14a and 14b of capacitor 10 are soldered to contacts 38a and 38b with contacts 38a and 38b contacting the same side of capacitor 10 as shown in FIG. 4b.

Figure 2A:
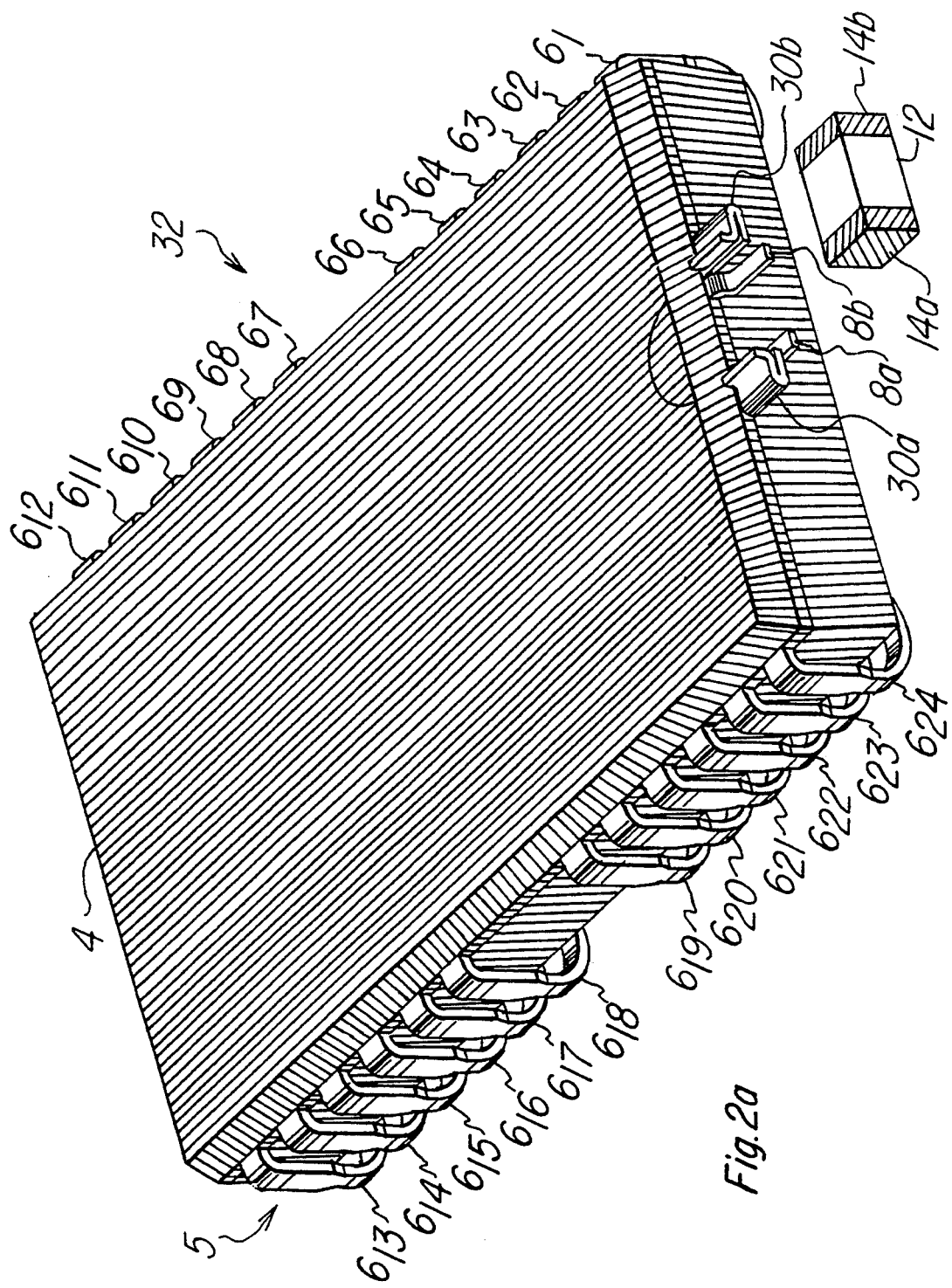
FIG. 2a is a perspective view of a packaged integrated circuit device according to a second embodiment of the invention.
Figure 2B:
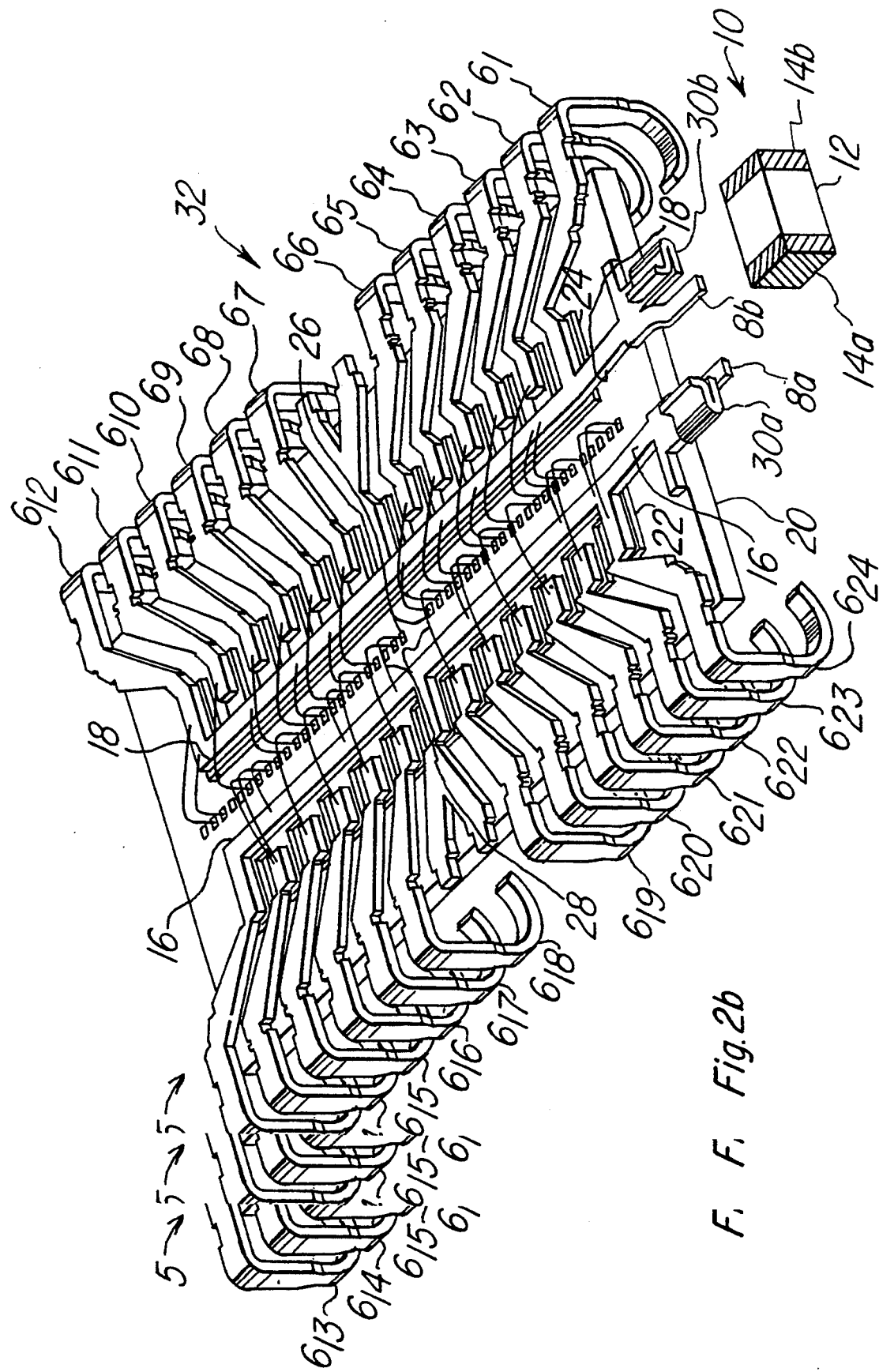
FIG. 2b shows the integrated circuit device of FIG. 2a with the plastic packaging removed.
Figure 2C:
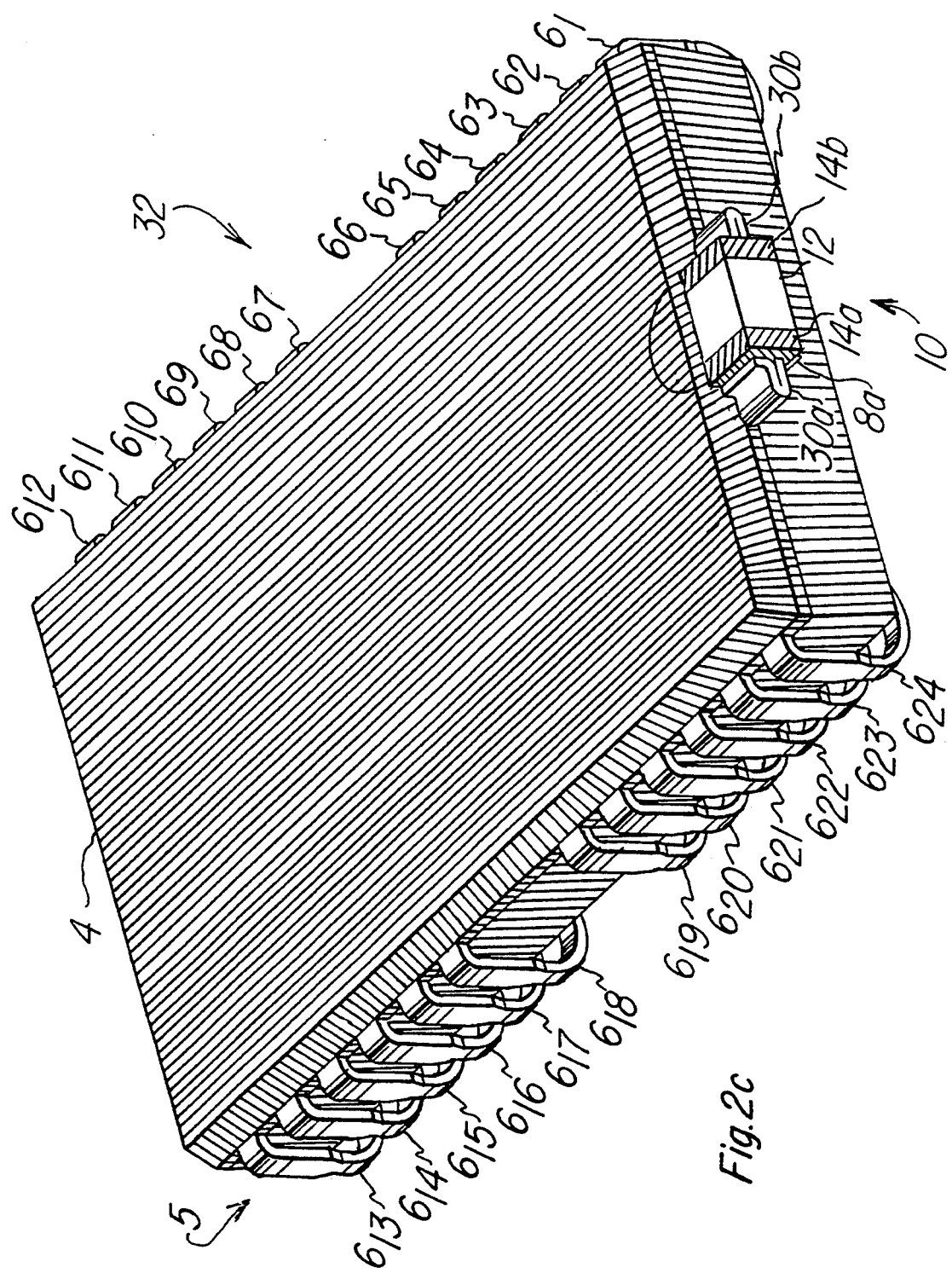
FIG. 2c shows the packaged integrated circuit device of FIG. 2a with a mounted decoupling capacitor.
Figure 2D:
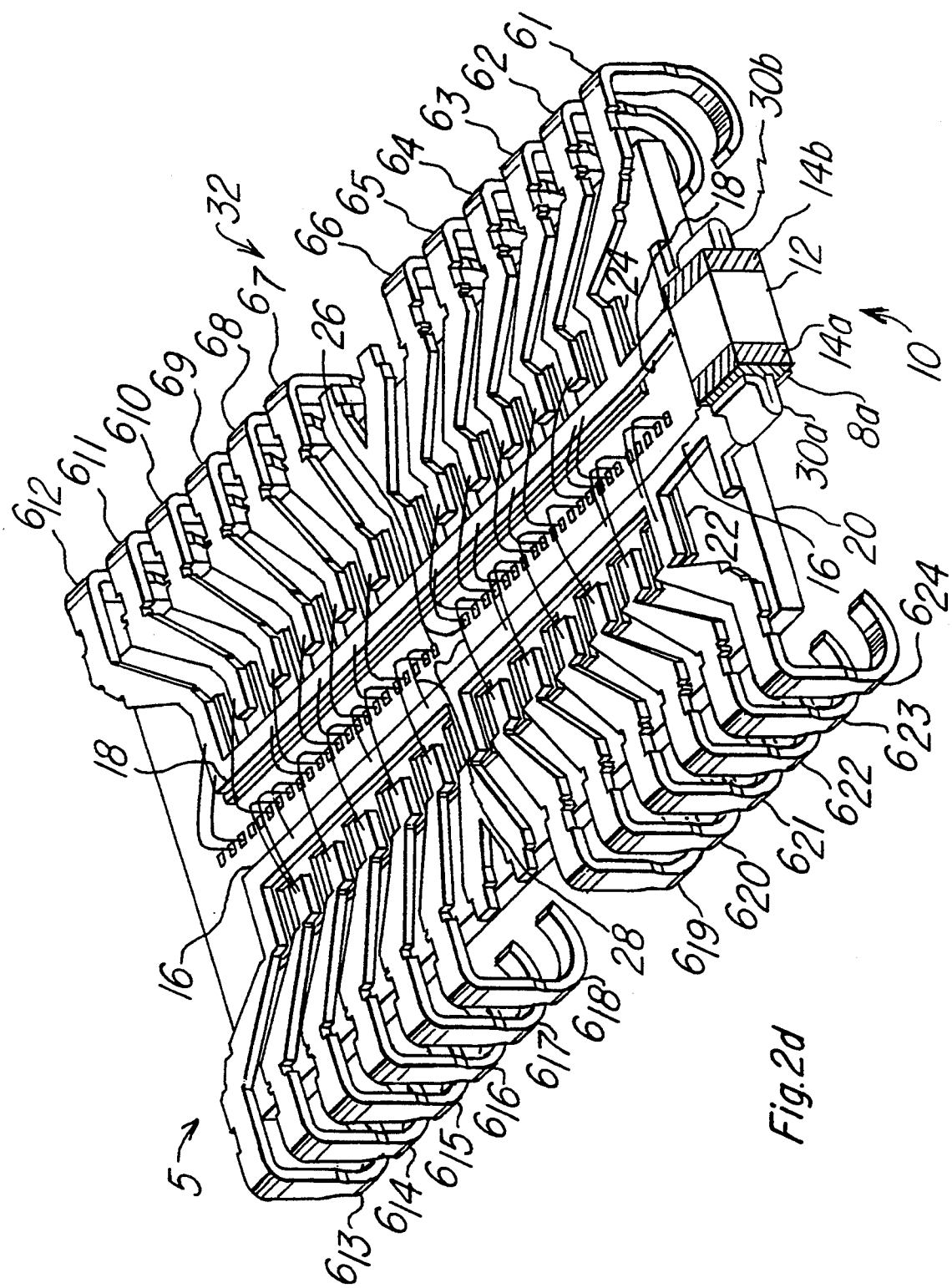
FIG. 2d shows the device of FIG. 2b with a mounted decoupling capacitor.
Figure 3A:
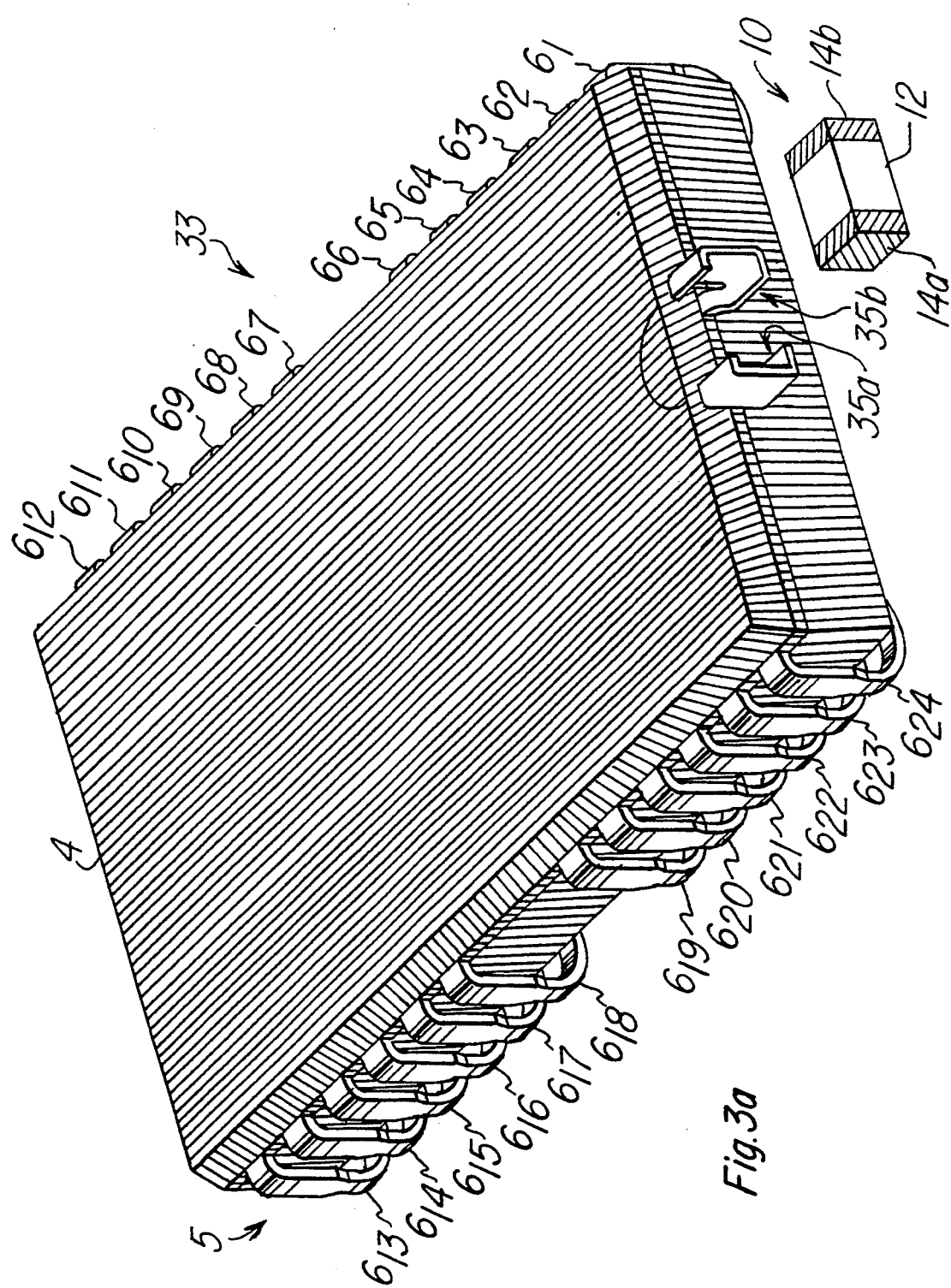
FIG. 3a is a perspective view of a packaged integrated circuit device according to a third embodiment of the invention.
Figure 3B:
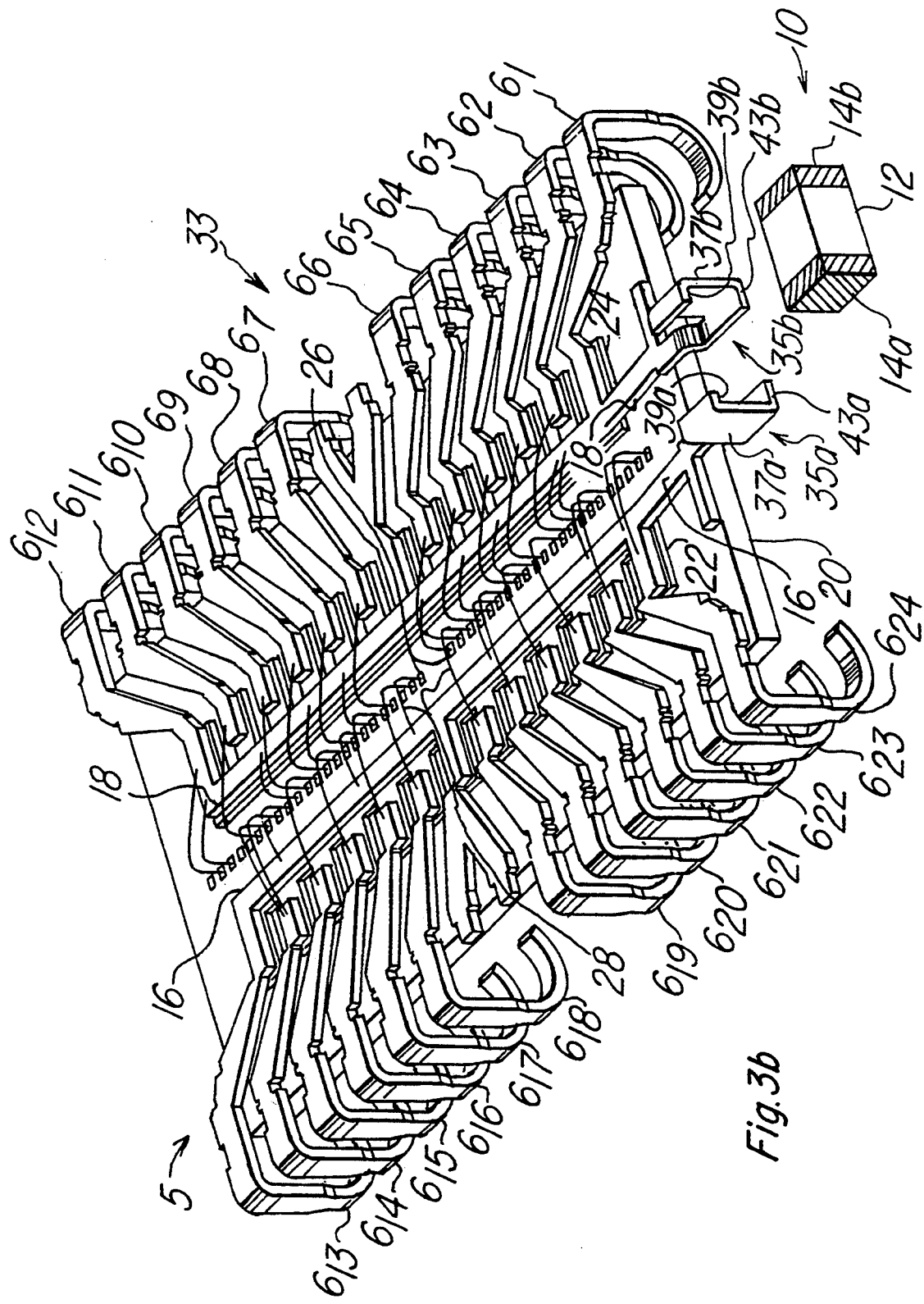
FIG. 3b shows the integrated circuit device of FIG. 3a with the plastic packaging removed.
Figure 3C:
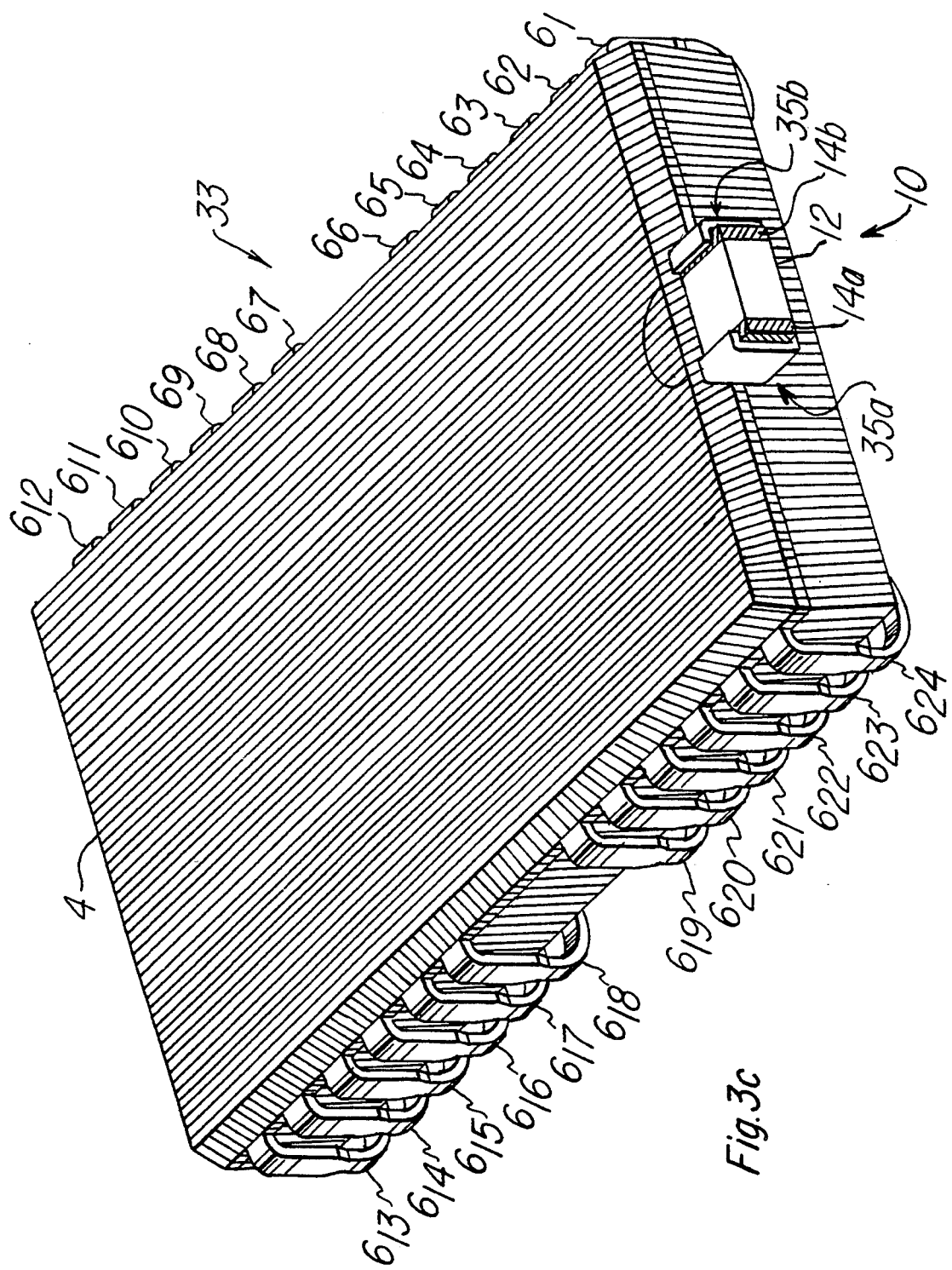
FIG. 3c shows the packaged integrated circuit device of FIG. 3a with a mounted decoupling capacitor.
Figure 3D:
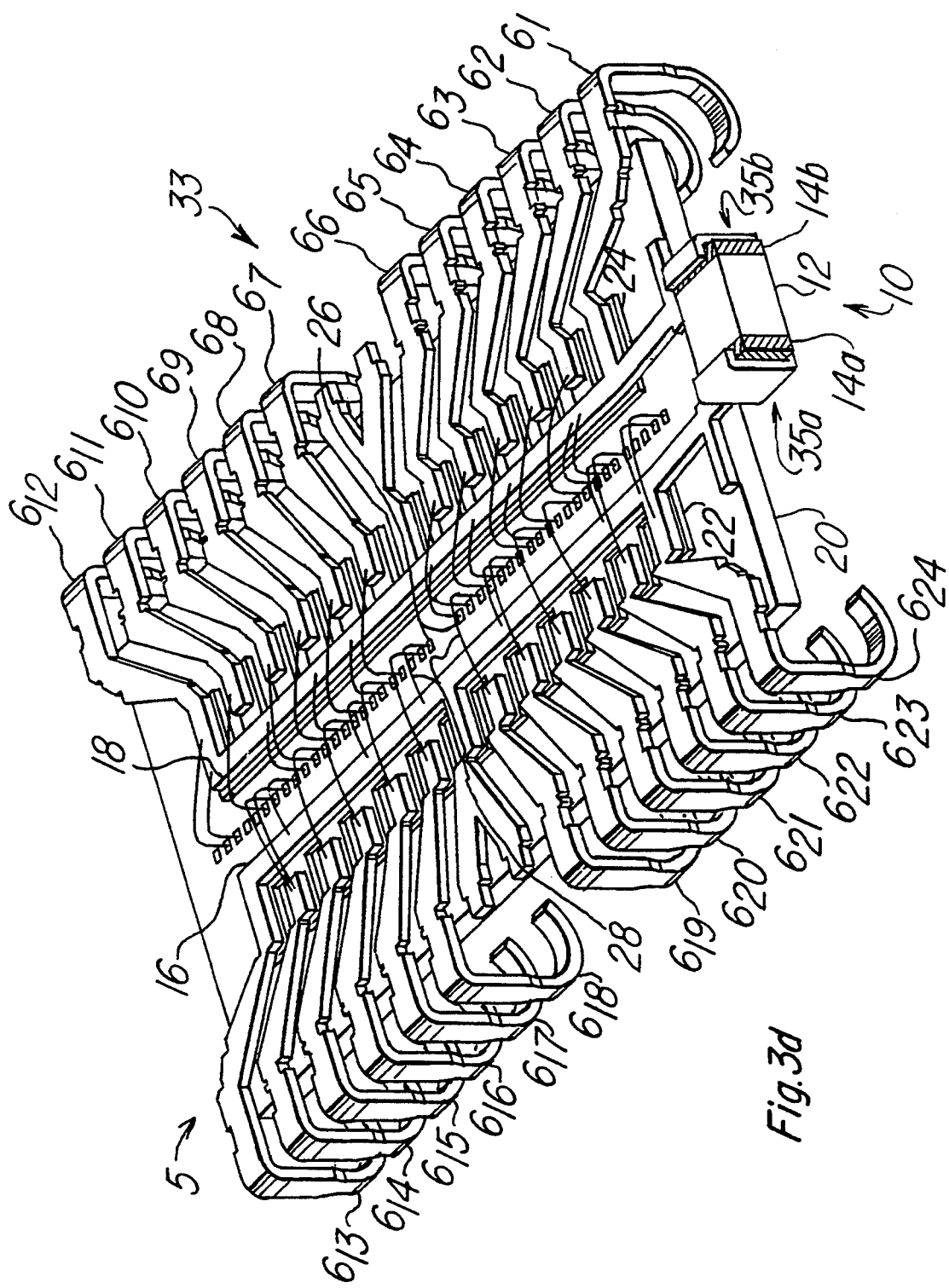
FIG. 3d shows the device of FIG. 3b with a mounted decoupling capacitor.

Contacts which contact opposing ends of capacitor 10, such as contacts 30a and 30b in FIG. 2a, may also be used in conjunction with or instead of contacts 38a and 38b in dual-in-line package (DIP) device 34. Alternatively, contacts that contact plural sides of capacitor 10, such as contacts 35a and 35b in FIG. 3a, may be used instead of contacts 38a and 38b in dual-in-line package (DIP) device 34.

FIGS. 5a and 5b show a packaged integrated circuit device 42 in a vertical, surface mount package. Device 42 has a lead frame that includes a plurality of leads 44 and a pair of capacitor contacts 46a and 46b extending from plastic package 41 as shown in FIG. 5a. When device 42 is mounted on a printed circuit board at least one of leads 44 is connected to a source of ground and at least one of the remaining leads 44 is connected to a source of power. Contact 46a is electrically connected with a lead 44 that supplies ground to device 42 via a lead frame ground bus (not shown) within plastic package 41. Contact 46b is electrically connected with a lead 44 that supplies power to device 42 via a lead frame power bus (not shown) within plastic package 41. Terminals 14a and 14b of capacitor 10 are soldered to contacts 46a and 46b with contacts 46a and 46b contacting the same of capacitor 10 as shown in FIG. 5b.

Contacts which contact opposing sides of capacitor 10, such as contacts 30a and 30b in FIG. 2a, may also be used in conjunction with or instead of contacts 46a and 46b in vertical, surface mount package device 42. Alternatively, contacts that contact plural sides of capacitor 10, such as contacts 35a and 35b in FIG. 3a, may be used instead of contacts 46a and 46b in device 42.

FIGS. 6a and 6b show a packaged integrated circuit device 48 in a small outline, surface mount package. Device 48 has a lead frame that includes a plurality of leads 50 and a pair of capacitor contacts 52a and 52b extending from plastic package 49 as shown in FIG. 6a. When device 48 is mounted on a printed circuit board at least one of leads 50 is connected to a source of ground and at least one of the remaining leads 50 is connected to a source of power. Contact 52a is electrically connected with a lead 50 that supplies ground to device 48 via a lead frame ground bus (not shown) within plastic package 49. Contact 52b is electrically connected with a lead 50 that supplies power to device 48 via a lead frame power bus (not shown) within plastic package 49. Terminals 14a and 14b of capacitor 10 are soldered to contacts 52a and 52b with contacts 52a and 52b contacting opposing ends of capacitor 10 as shown in FIG. 6b.

Contacts which contact the same side of capacitor 10, such as contacts 8a and 8b in FIG. 1a, may also be used in conjunction with or instead of contacts 52a and 52b in small outline, surface mount package device 48. Alternatively, contacts that contact plural sides of capacitor 10, such as contacts 35a and 35b in FIG. 3a, may be used instead of contacts 52a and 52b in device 48.

Figure 7A:
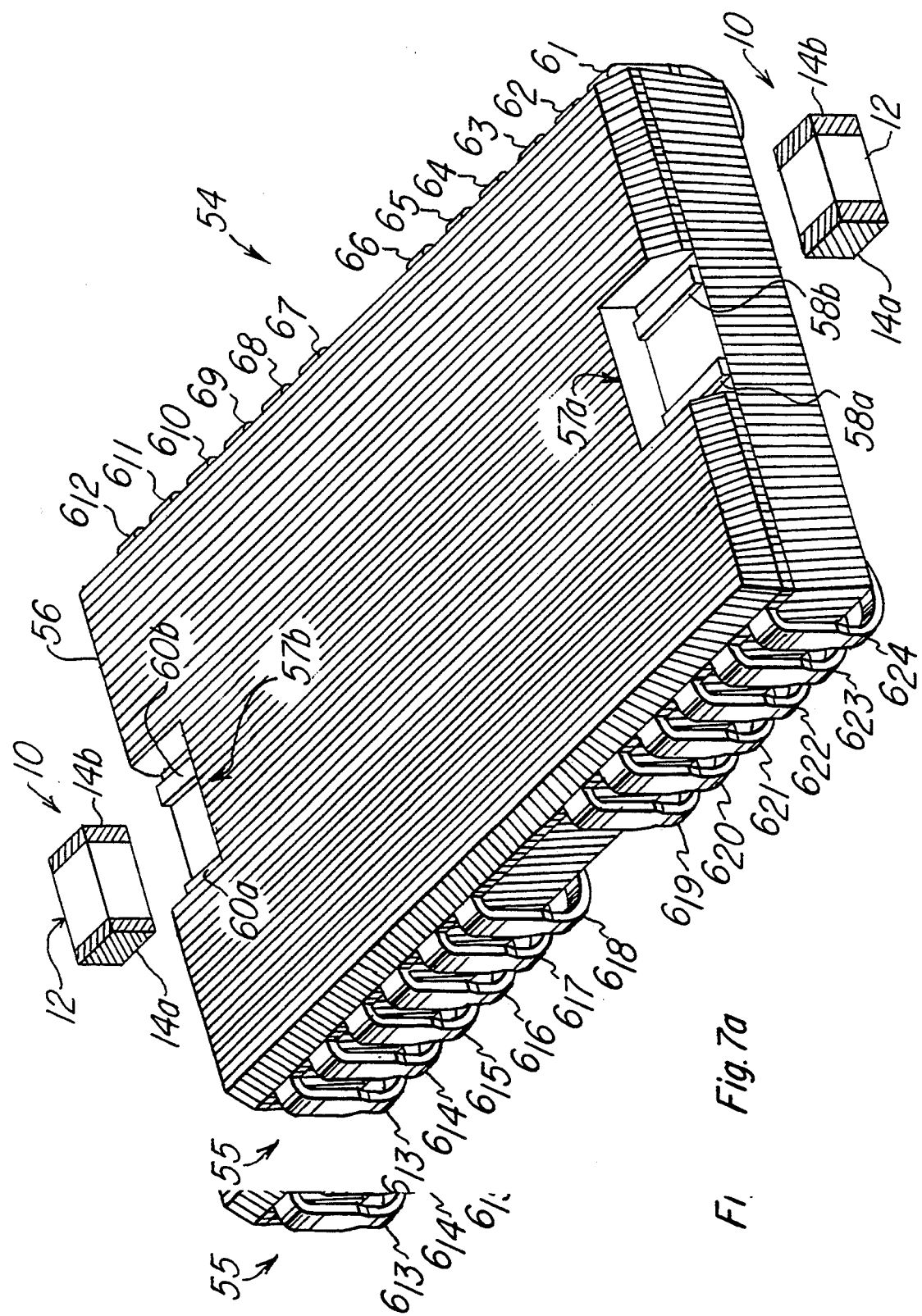
FIG. 7a is a perspective view of a packaged integrated circuit device according to a seventh embodiment of the invention.

FIGS. 7a–7d show a plastic packaged integrated circuit memory device 54 according to another embodiment of the invention. As seen in FIG. 7a, device 54 is identical to device 2 of FIGS. 1a–1d with the exceptions that lead frame 55 has first and second sets of contacts 58a, 58b and 60a, 60b, respectively, in place of contacts 8a and 8b and that package 56 has recessed regions 57a and 57b. Package 56 encapsulates a portion of lead frame 55 leaving contacts 58a and 58b exposed in recessed region 57a and contacts 60a and 60b exposed in recessed region 57b. Contacts 58a and 58b extend from one end of package 56 into recessed region 57a. Contacts 60a and 60b extend from the other end of package 56 into recessed region 57b. Contacts 58a and 58b and contacts 60a and 60b preferably do not extend beyond the outline of device 54. Contacts 58a and 58b contact terminals 14a and 14b, respectively, on the same side of a first bypass capacitor 10. Contacts 60a and 60b contact terminals 14a and 14b, respectively, on the same side of a second bypass capacitor 10.

A bypass capacitor 10 may be mounted in either or both recessed regions 57a and 57b. The provision of a plurality of bypass capacitor mounting positions insures effective decoupling in devices having plural power leads, such as leads $6_1$ and $6_{12}$, one or more of which may be coupled to an external Vdd power supply, or plural ground leads, such as leads $6_{13}$ and $6_{24}$, one or more of which may be coupled to an external source of ground.

Figure 7B:
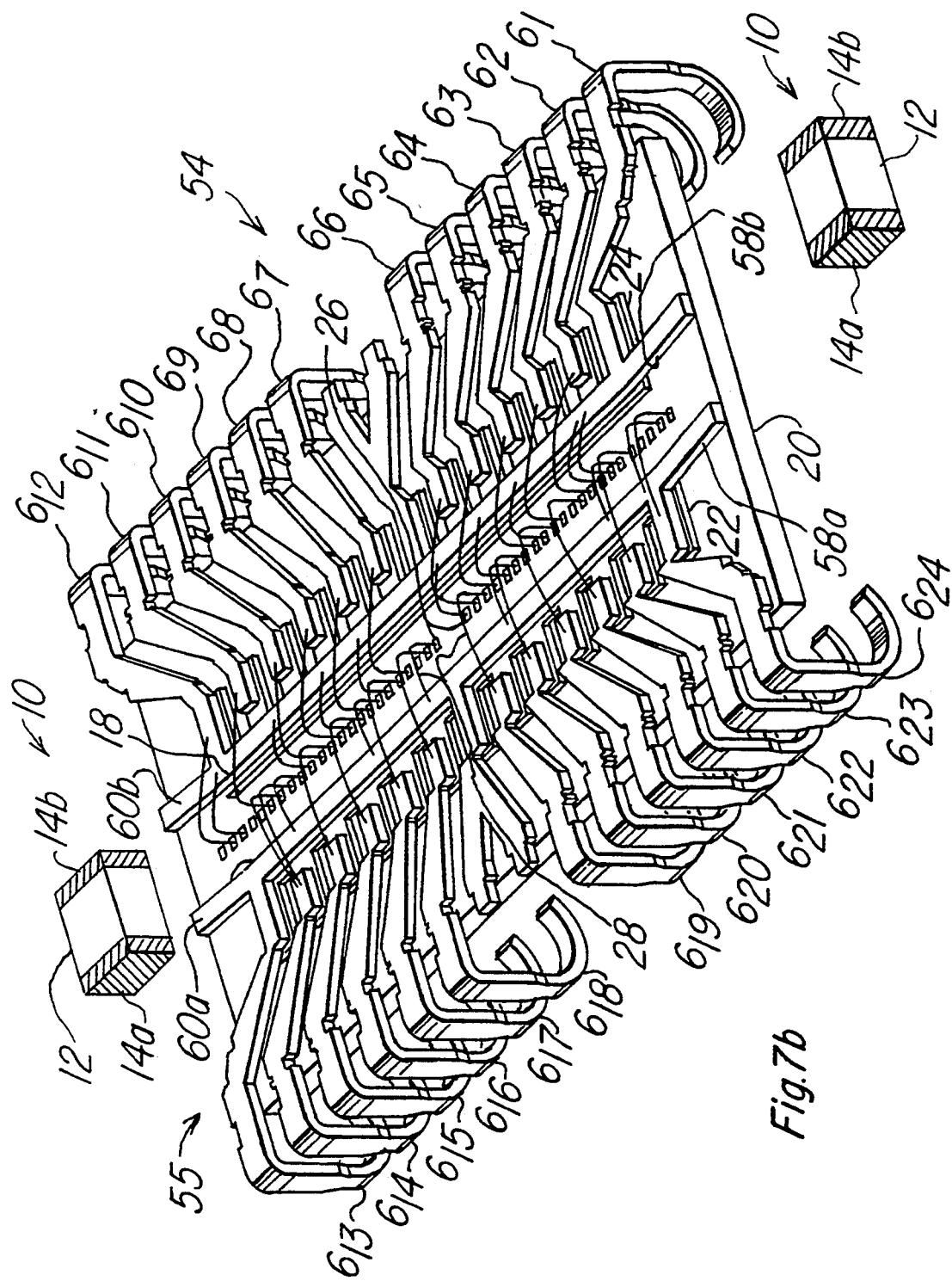
FIG. 7b shows the integrated circuit device of FIG. 1a with the plastic packaging removed.

As shown in FIG. 7b, contacts 58a and 60a are integrally formed with and extend from opposite ends of ground bus portion 16 of lead frame 55. Contacts 58b and 60b are integrally formed with and extend from opposite ends of Vdd bus portion 18 of lead frame 55.

Figure 7C:
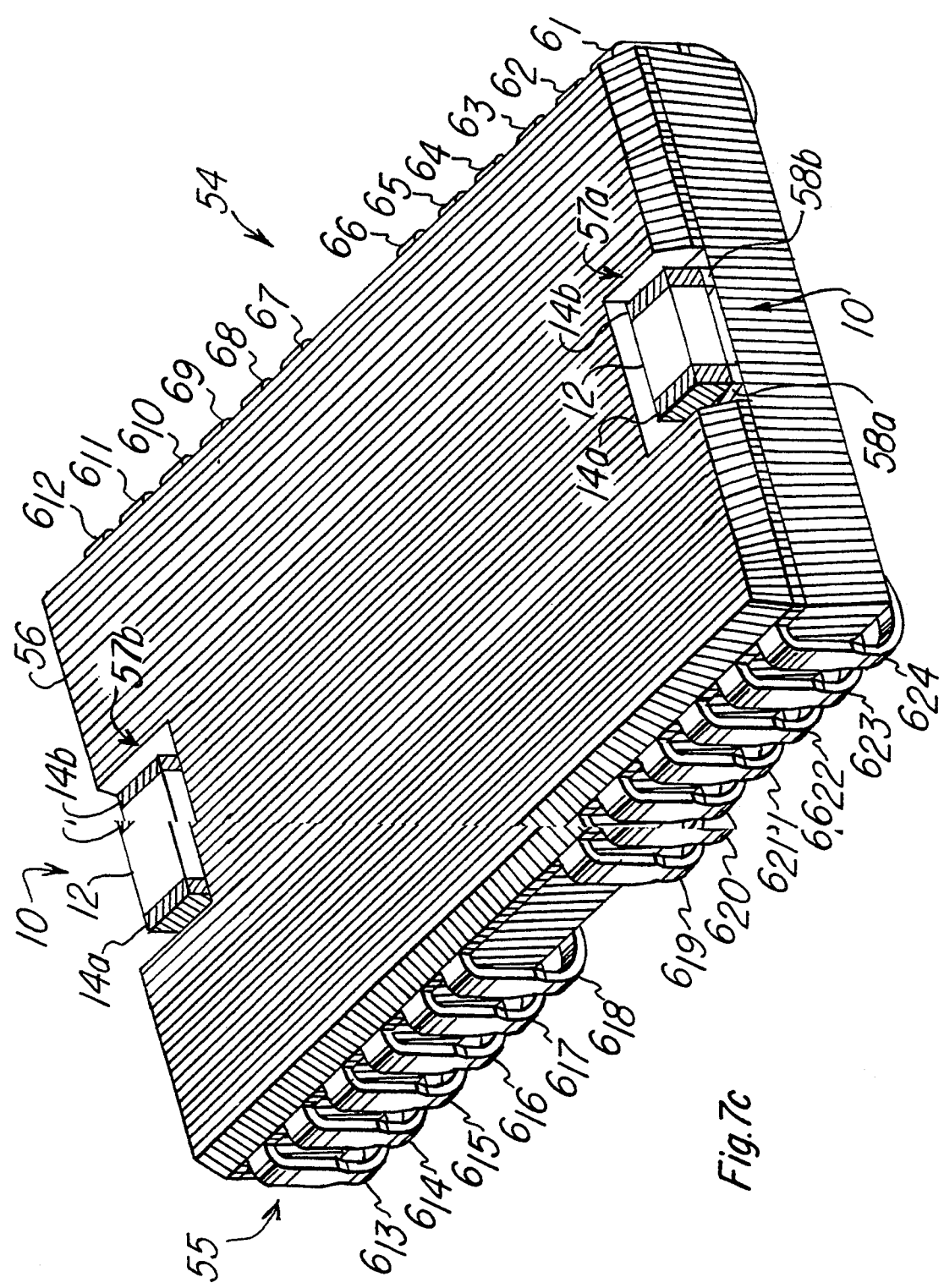
FIG. 7c shows the packaged integrated circuit device of FIG. 7a with a mounted decoupling capacitor.

Bypass capacitors 10 may be mounted on device 54 by soldering terminals 14a to contacts 58a and 60a and by soldering terminals 14b to contacts 58b and 60b. Recessed regions 57a and 57b preferably have dimensions which permit capacitors 10 to be mounted on device 54 without extending beyond the outline of device 54 as shown in FIG. 7c. With contacts 58a, 58b, 60a, 60b and capacitors 10 contained within the outline of device 54, the mounting density of devices on a printed circuit board is optimized. In addition, maintaining contacts 58a, 58b, 60a, 60b and bypass capacitors 10 within the outline of device 54 serves to protect the contacts and bypass capacitors during shipping and circuit board assembly.

Contacts which contact the opposing sides of capacitor 10, such as contacts 30a and 30b in FIG. 2a, may also be used in conjunction with or instead of contacts 58a, 58b, 60a, and 60b in device 54. Alternatively, contacts that contact plural sides of capacitor 10, such as contacts 35a and 35b in FIG. 3a, may be used instead of contacts 58a, 58b, 60a, and 60b in device 54.

A few preferred embodiments have been described in detail hereinabove. It is to be understood that the scope of the invention also comprehends embodiments different from those described, yet within the scope of the claims.

For example, other types of packages may be used, materials other than plastic may be used for encapsulating the die, the contacts may extend from other sides or the top or bottom surfaces of the package, the contacts and leads may extend from the same side of the package, contacts having different shapes may be used, contacts for more than two capacitors may be provided, non-ceramic two-terminal capacitors may be used, or two-terminal components other than capacitors may be mounted on the contacts.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit device, comprising:
a semiconductor die;
first and second contacts electrically connected to said semiconductor die;
packaging material encapsulating said die, said packaging material having an outer periphery, said first and second contacts extending from said packaging material beyond said outer periphery for supporting an electrical component externally from the outer periphery of said packaging material, at least one of said first and second contacts arranged so as to contact one of first and second spaced apart terminals of said electrical component on a plurality of sides of said electrical component.

2. The integrated circuit device of claim 1, in which both of said first and second contacts are arranged so as to contact said first and second spaced apart terminals of said electrical component on a plurality of sides of said electrical component.

3. An integrated circuit device, comprising:
a semiconductor die;
first and second contacts electrically connected to said semiconductor die;
packaging material encapsulating said die, said packaging material having an outer periphery, said first and second contacts extending from said packaging material beyond said outer periphery for supporting an electrical component externally from the outer periphery of said packaging material, wherein said first and second contacts hold said electrical component with spring tension.

4. An integrated circuit device, comprising:
a semiconductor die;
first and second contacts electrically connected to said semiconductor die, each of said first and second contacts having first and second opposing surfaces;
third and fourth contacts electrically connected to said semiconductor die:
packaging material encapsulating said die, said packaging material having an outer periphery, said first and second opposing surfaces of said first and second contacts extending from said packaging material beyond said outer periphery for supporting an electrical component externally from the outer periphery of said packaging material, said third and fourth contacts extending from said packaging material beyond said outer periphery for electrical connection to terminals of said electrical component, said third contact electrically connected to said first contact, said fourth contact electrically connected to said second contact.

5. The integrated circuit device of claim 4, in which said first and second contacts are positioned so as to contact first and second spaced apart terminals of said electrical component on a same side of said electrical component.

6. The integrated circuit device of claim 4, in which said third and fourth contacts are positioned so as to contact first and second spaced apart terminals of said electrical component on opposing sides of said electrical component.

7. The integrated circuit device of claim 6, in which said third and fourth contacts hold said electrical component with spring tension.

* * * * *